(12) United States Patent
Huang et al.

(10) Patent No.: US 9,915,679 B2
(45) Date of Patent: Mar. 13, 2018

(54) METHOD OF DETECTING WHETHER MICROELECTROMECHANICAL SYSTEM DEVICE IS HERMETIC

(71) Applicant: SensorTek technology Corp., Hsinchu County (TW)

(72) Inventors: Hsin-Hung Huang, Hsinchu County (TW); Wei-Yang Ou, Hsinchu County (TW); Hung-Sen Chen, Hsinchu County (TW)

(73) Assignee: SensorTek technology Corp., Hsinchu County (TW)

( * ) Notice: Subject to any disclaimer, the term of this patent is extended or adjusted under 35 U.S.C. 154(b) by 218 days.

(21) Appl. No.: 15/093,765

(22) Filed: Apr. 8, 2016

(65) Prior Publication Data

US 2017/0227575 A1 Aug. 10, 2017

(30) Foreign Application Priority Data

Feb. 4, 2016 (TW) .............................. 105103664 A

(51) Int. Cl.
*G01P 15/12* (2006.01)
*B81C 99/00* (2010.01)
*G01P 21/00* (2006.01)
*G01C 19/5783* (2012.01)
*G01C 25/00* (2006.01)
*G01P 15/08* (2006.01)
*G01P 15/125* (2006.01)

(52) U.S. Cl.
CPC .......... *G01P 21/00* (2013.01); *G01C 19/5783* (2013.01); *G01C 25/00* (2013.01); *G01P 15/0802* (2013.01); *G01P 15/125* (2013.01); *B81C 99/0045* (2013.01); *G01P 2015/0814* (2013.01); *G01P 2015/0831* (2013.01)

(58) Field of Classification Search
CPC ............. B81B 2207/11; B81C 99/0045; B81C 2203/0145; B81C 99/0035; H01L 2924/1461; H01L 2924/181
See application file for complete search history.

(56) References Cited

U.S. PATENT DOCUMENTS 6,986,278 B2 * 1/2006 Schatz ................ B81C 99/0045
73/49.3
7,906,823 B2 * 3/2011 Suzuki ................ B81C 1/00269
257/417
9,513,184 B2 * 12/2016 Goossens .............. G01L 27/005
(Continued)

FOREIGN PATENT DOCUMENTS

| CN | 103308239 A | 9/2013 |
| CN | 105293422 A | 2/2016 |
| TW | I256940 | 6/2006 |

*Primary Examiner* — David A Rogers
(74) *Attorney, Agent, or Firm* — Winston Hsu

(57) ABSTRACT

A method of detecting whether a microelectromechanical system (MEMS) device is hermetic includes applying at least three voltage differences between a movable part and a sensor electrode of the MEMS device to measure at least three effective capacitances, calculating a capacitance-to-voltage curve and an offset voltage of the MEMS device according to the at least three effective capacitances; and determining whether the offset voltage is within a predetermined range to determine whether MEMS device is hermetic.

10 Claims, 7 Drawing Sheets

(56) References Cited

U.S. PATENT DOCUMENTS

| | | | |
|---|---|---|---|
| 2007/0128759 A1* | 6/2007 | Dewes | B81C 99/0045 438/53 |
| 2008/0169521 A1* | 7/2008 | Foster | B81B 7/0041 257/415 |
| 2009/0050988 A1* | 2/2009 | Suzuki | B81C 1/00269 257/415 |
| 2009/0289349 A1* | 11/2009 | Novotny | B81B 7/0041 257/698 |
| 2010/0154517 A1* | 6/2010 | Sammoura | B81C 99/0045 73/49.3 |
| 2012/0100657 A1* | 4/2012 | Di Cioccio | B81C 1/00269 438/51 |
| 2014/0356989 A1 | 12/2014 | Chen | |

* cited by examiner

METHOD OF DETECTING WHETHER MICROELECTROMECHANICAL SYSTEM DEVICE IS HERMETIC

BACKGROUND OF THE INVENTION

1. Field of the Invention

The present invention relates to a method of determining whether a MEMS device is hermetic, and more particularly, to a method of determining whether a MEMS device is hermetic by applying multiple voltage differences between a movable part and a sensor electrode to measure multiple effective capacitances of the MEMS device, so as to evaluate a symmetry of a capacitance-to-voltage curve of the MEMS device.

2. Description of the Prior Art

MicroElectroMechanical System (MEMS) device is a special type of integrated-circuit (IC), which detects displacement behaviors of a movable part to derive acceleration or angular speed of an electronic device, thereby operates as an accelerometer or a gyroscope.

To improve sensitivity and accuracy of the MEMS device, the movable part is hermetically encapsulated in a package to ensure the displacement behaviors of the movable part is free from contaminants such as dust and water vapors. Based on different designs and application requirements, the package can be filled with inert gas or evacuated to vacuum to build the hermetic system with different pressures and desired operational characteristics. Meanwhile, the hermetic system further ensures the reliability and endurance of the MEMS device since it is waterproof and/or anti-oxidation to protect the MEMS device from damage. Therefore, once the hermeticity of the MEMS device is broken, a proper and sensitive waning indication is required.

Currently, the hermeticity of the MEMS device is mostly detected by measuring electronic characteristics, such as a leakage current, of the MEMS device. Also, the hermeticity influences a frequency response associated with Q-factor of the MEMS device, so the hermeticity of the MEMS device can be detected by measuring the frequency response associated with Q-factor.

However, the two measurements above mentioned are difficult to perform and with low sensitivity. Consequently, there is a need to improve the prior art.

SUMMARY OF THE INVENTION

It is therefore an objective of the present invention to provide a method of determining whether a MEMS device is hermetic by applying multiple voltage differences between a movable part and a sensor electrode to measure multiple effective capacitances of the MEMS device, so as to evaluate the symmetry of a capacitance-to-voltage curve of the MEMS device.

The present invention discloses a method of determining whether a MEMS device is hermetic. The method includes applying at least three different voltage differences between a movable part and a sensor electrode of the MEMS device to measure at least three effective capacitances, calculating a capacitance-to-voltage curve and an offset voltage of the MEMS device according to the at least three effective capacitances, and determining whether the offset voltage is within a predetermined range to determine whether MEMS device is hermetic.

The present invention further discloses a method of determining whether a MEMS device is hermetic. The method includes applying a first voltage difference and a second voltage difference between a first sensor electrode and a movable part of the MEMS device to measure a first effective capacitance and a second effective capacitance, comparing the first effective capacitance with the second effective capacitance to calculate an effective capacitance difference, and determining whether the effective capacitance difference is within a predetermined range to determine whether MEMS device is hermetic.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
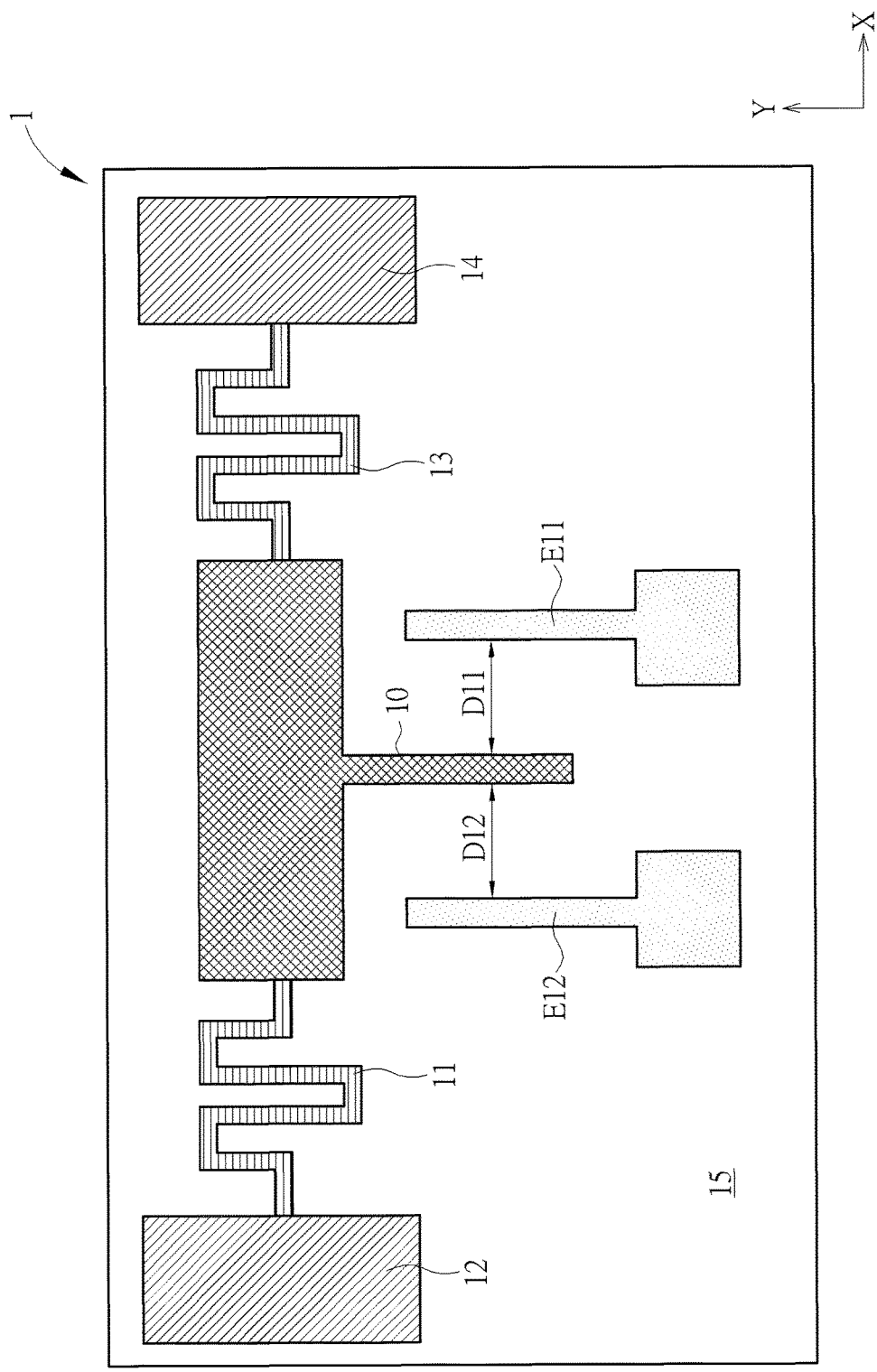
FIG. 1 illustrates a top view of an exemplary comb-drive MEMS device.

FIG. 1 illustrates a top view of an exemplary comb-drive MEMS device 1. Based on different application requirements, there are comb-drive MEMS devices with different types and structures, which is not limited to FIG. 1. The comb-drive MEMS device 1 is used for detecting in-plane (i.e., X-Y plane) acceleration, and includes a movable part 10, two springs 11 and 13, two anchors 12 and 14, two fixed sensor electrodes E11 and E12, and a base 15. The anchors 12 and 14, and the fixed sensor electrodes E11 and E12 are immovable parts fixed on the base 15, while the movable part 10 and the springs 11 and 12 are floating and movable, where the movable part 10 is connected to the anchors 12 and 14 via the springs 11 and 12. When the MEMS device 1 is displaced by an external force, the anchors 12 and 14, and the sensor electrodes E11 and E12 which are fixed on the base 15 are displaced simultaneously, while the movable part 10 tends to stay still due to the nature of inertia. In such a situation, the springs 11 and 13 are compressed or extended due to the external force, and finally the relative locations between the movable part 10 and the sensor electrodes E11 and E12 are changed to produce corresponding sensing capacitance variations between the movable part 10 and the sensor electrodes E11 and E12. For example, given that there are distances D11 and D12 between the movable part 10 and the sensor electrodes E11 and E12 when the MEMS device 1 is still, respectively. If the MEMS device 1 is displaced toward an X direction due to the external force, the anchors 12 and 14 simultaneously move toward the X direction, and the movable part 10 tends to stay still, so the springs 11 and 13 are respectively compressed and extended. Meanwhile, the fixed sensor electrodes E11 and E12 also move toward the X direction, so the distance D11 between the movable part 10 and the sensor electrode E11 is increased and the distance D12 and between the movable part 10 and the sensor electrode E12 is decreased. As a result, the sensing capacitance between the movable part 10 and the sensor electrode E11 is decreased, and the sensing capacitance between the movable part 10 and the sensor electrode E12 is increased.

In other words, applying the external force to the MEMS device 1 changes the distances D11 and D12, so the acceleration and its direction generated by external force can be further computed according to the sensing capacitance variations due to the variations of the distances D11 and D12. Therefore, by the above mentioned operations, the MEMS device 1 can realize the in-plane accelerometer.

Figure 2A:
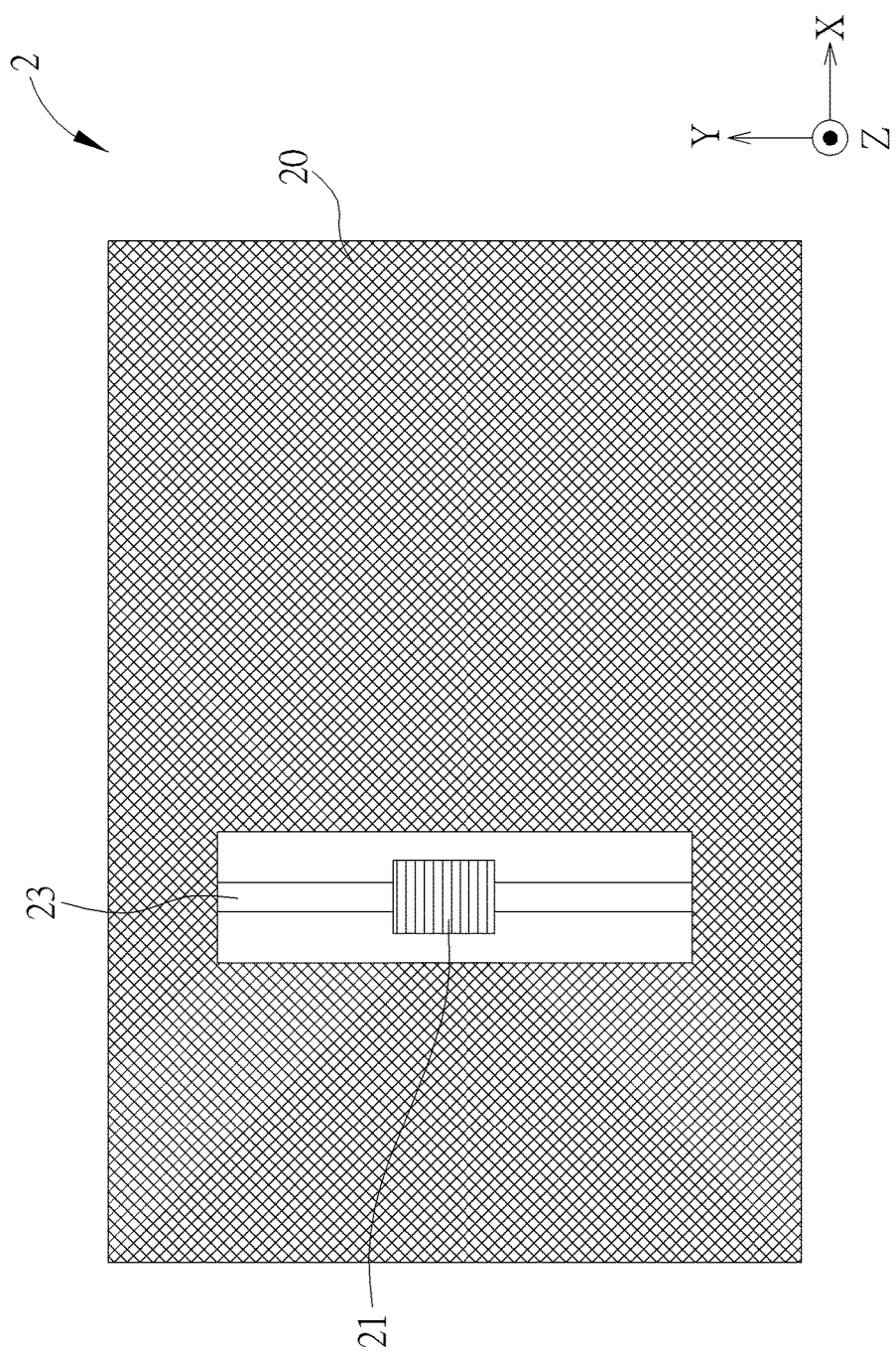
FIG. 2A and FIG. 2B illustrate a top view and a section view of an exemplary torsion bar MEMS device, respectively.
Figure 2B:
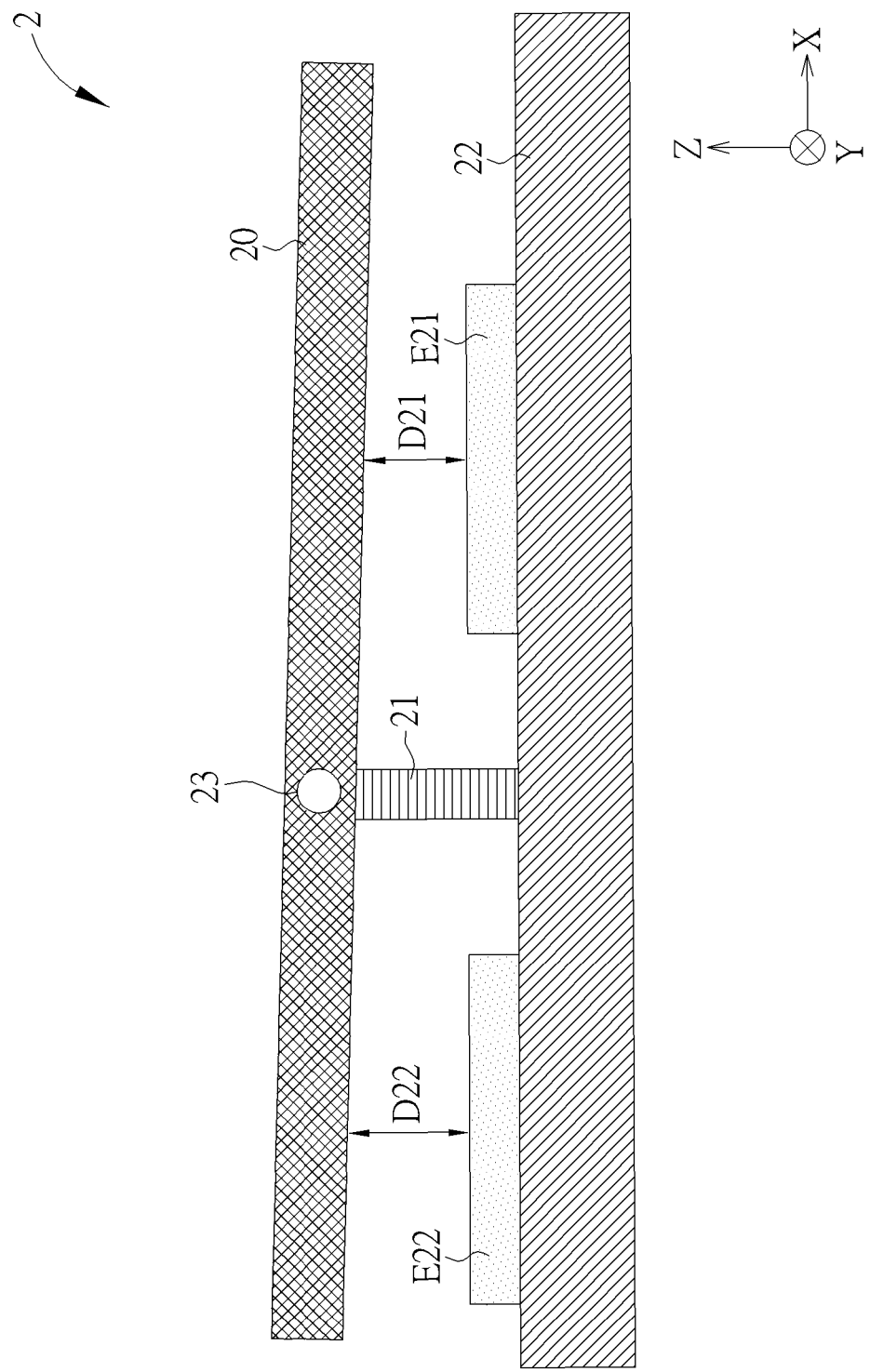

FIG. 2A and FIG. 2B illustrate a top view and a section view of an exemplary torsion bar MEMS device 2, respectively. Based on different application requirements, there are torsion bar MEMS devices with different types and structures, which is not limited to FIG. 2. The torsion bar MEMS device 2 is used for detecting out-of-plane (i.e., Z direction) acceleration, and includes a movable part (movable capacitive plate) 20, a supporter 21, a substrate 22, a torsion bar 23, and two fixed sensor electrodes E21 and E22 (which are capacitive plates with the same area). The MEMS device 2 presents an unbalanced seesaw structure with the torsion bar 23 to be the axial. In FIG. 2A, the torsion bar 23 is disposed away from the center of mass of the movable part 20 and close to left portion of movable part 20, which makes the movable part 20 to tilt toward the portion with greater mass of the movable part 20. For example, given that there are distances D21 and D22 between the movable part 20 and the sensor electrodes E21 and E22 when the MEMS device 2 is still, respectively. If the gravity force directs toward -Z direction, and the movable part 20 is divided by the torsion bar 23, the right portion of the movable part 20 has a greater mass than that of the left portion. Therefore, in FIG. 2B, the movable part 20 tilts toward the sensor electrode E21 to present the unbalanced seesaw structure, where the distance D21 is less than the distance D22. The movable part 20 twists when an external force is applied to the MEMS device 2, which changes the distances D21 and D22 between the movable part 20 and the fixed sensor electrodes E21 and E22. According to variations of sensing capacitance between the movable part 20 and the sensor electrodes E21 and E22, the tilted direction and acceleration of the movable part 20 can be computed. Specifically, when the MEMS device 2 is displaced toward the -Z direction by the external force, the supporter 21 fixed on the substrate 22, the torsion bar 23, and the sensor electrodes E21 and E22 are also displaced toward the -Z direction. The movable part 20 tends to tilt toward the -Z direction due to the less mass of the left portion, while the right portion of the movable part 20 with greater mass tends to stay still due to the nature of inertia. In such a situation, the movable part 20 twists counterclockwise, thereby the distance D21 between the movable part 20 and the sensor electrode E21 increases, and the distance D22 between the movable part 20 and the sensor electrode E22 decreases. Finally, the sensing capacitance induced from the sensor electrode E21 decreases, and the sensing capacitance induced from the sensor electrode E22 increases. In other words, applying the external force to the MEMS device 2 changes the distances D21 and D22, so the acceleration and corresponding direction can be computed according to the sensing capacitance variations due to the variations of the distances D21 and D22. Therefore, by the above mentioned operations, the MEMS device 2 can realize the out-of-plane accelerometer.

Based on Coulomb's law (the magnitude of the electrostatic force of interaction between two point charges is positively proportional to the scalar multiplication of the magnitudes of charges, and inversely proportional to the square of the distance between them), in the embodiment of FIG. 1, when a voltage difference is applied between the movable part 10 and the sensor electrode E11 or E12, the electrostatic force can be induced between the movable part 10 and the sensor electrode E11 or E12, so the movable part 10 and the sensor electrode E11 or E12 are attracted due to the electrostatic force, which changes the distances D11 and D12. Accordingly, the electrostatic force induced by applying the voltage difference makes the MEMS device 1 to produce corresponding sensing capacitance variations.

In the embodiment of FIG. 2A and FIG. 2B, when a voltage difference is applied between the movable part 20 and the sensor electrode E21 or E22, the electrostatic force can be induced between the movable part 20 and the sensor electrode E21 or E22, so the movable part 20 and the sensor electrode E21 or E22 are attracted due to the electrostatic force, which changes the distances D21 and D22. Accordingly, the electrostatic force induced by applying the voltage difference makes the MEMS device 2 to produce corresponding sensing capacitance variations.

Figure 3:
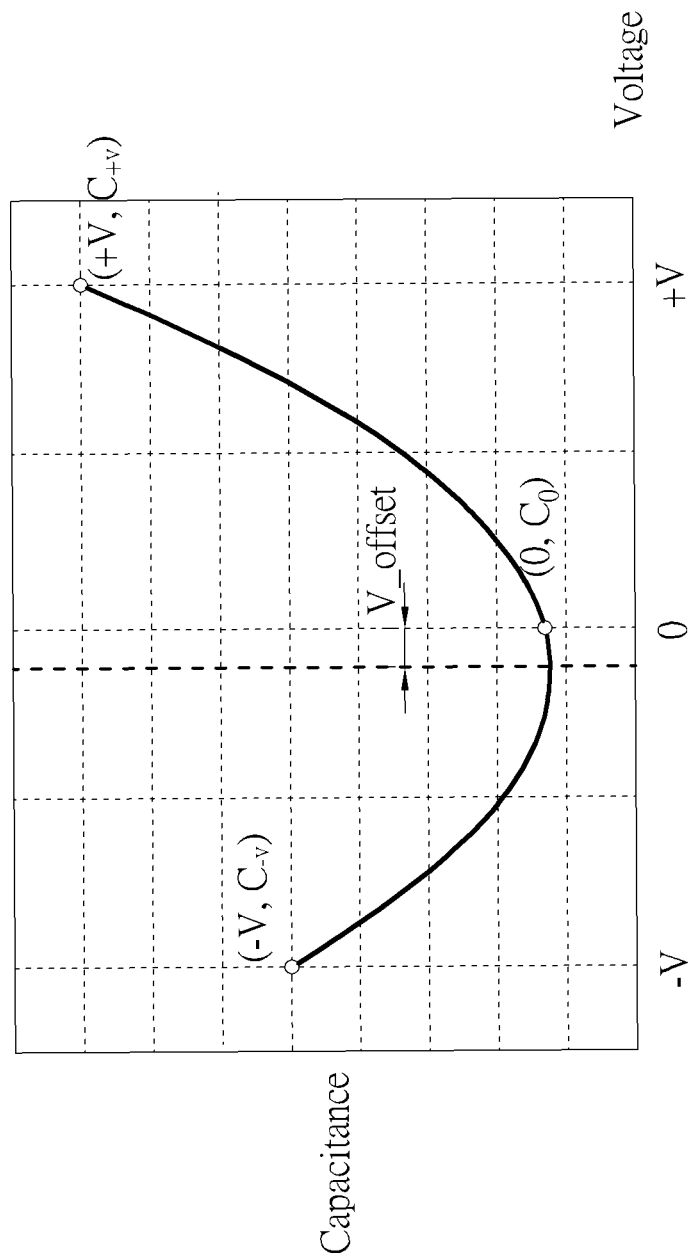
FIG. 3 illustrates a capacitance-voltage curve of a MEMS device according to an embodiment of the present invention.

FIG. 3 illustrates a capacitance-to-voltage curve of a MEMS device according to an embodiment of the present invention. For most of the MEMS devices (e.g., the MEMS devices 1 and 2 in FIG. 1 and FIG. 2), applying the voltage difference between the movable part and the sensor electrode of the MEMS device produces a static electric force between the movable part and the sensor electrode, which makes the movable part to tilt or twist to change the effective capacitances of the MEMS device. Accordingly, an effective capacitance-to-voltage curve can be obtained by applying different voltage differences between the movable part and the sensor electrode to measure corresponding effective capacitances.

Ideally, the ideal capacitance-to-voltage curve of the MEMS device shall be a parabola approximately symmetric about zero voltage. Therefore, the same effective capacitance can be measured if two voltage differences with the same value but opposite polarities are applied between the movable part and the sensor electrode. However, a potential static electric force might be produced during manufacturing process of the MEMS device. For example, the potential static electric force may be produced by accumulated charges to generate an effective voltage difference between the movable part and the sensor electrode, which leads to displacement and twist to the movable part without applying any voltage difference. As a result, the capacitance-to-voltage curve of the MEMS device displaces by an offset, i.e. an offset voltage V_offset. In addition, if the MEMS device encounters packaging process problems or improper collisions in the following manufacturing process to damage the hermeticity of the MEMS device, the capacitance-to-voltage curve and its offset voltage V_offset change as well.

Once the MEMS device is made, packaging and testing processes are performed for quality management. For the MEMS devices made in the same batch, those with good hermeticity have the offset voltages within a specific voltage interval, while those with bad hermeticity have the offset voltages out of the specific voltage interval. In practice, the packaging and testing manufacturers perform a series of testing procedures to all of the MEMS devices made in the same batch, and decide a target capacitance-to-voltage curve and a target offset voltage for the MEMS devices made in the same batch according to application requirements, analysis and statistics of the test results of all of the MEMS devices made in the same batch. Therefore, the develop and research staff can set a predetermined range for the measured offset voltage V_offset (or the effective capacitance) according to the target capacitance-to-voltage curve and the target offset voltage, where the predetermined range is used as a standard in determining whether the MEMS device is hermetic.

In FIG. 3, a practical capacitance-to-voltage curve can be an open up parabola with the vertex being the offset voltage V_offset. In other embodiments, the vertex, shape and direction of opening of the parabola may be different based on different testing techniques, which is not limited. Therefore, applying voltage differences +V and −V with the same value but opposite polarities between the movable part and the sensor electrode will produce different effective capacitances. Take the MEMS device 2 in FIG. 2A and FIG. 2B for example, given that the offset voltage V_offset of the sensor electrode E21 is −0.5 volts, applying the voltage difference +V with +1.5 volts between the movable part 20 and the sensor electrode E21 produces the effective capacitance $C_{+V}$ which is equivalent to the capacitance produced by applying the voltage difference with +2 volts when the offset voltage is zero volt. Applying the voltage difference −V with −1.5 volts between the movable part 20 and the sensor electrode E21 produces the effective capacitance $C_{-V}$ which is equivalent to the capacitance produced by applying the voltage difference with −1 volt when the offset voltage is zero volt. On the other hand, given that the offset voltage V_offset of the sensor electrode E21 is +0.5 volts, opposite measurement results will be produced. Specifically, applying the voltage difference +V being +1.5 volts and the voltage difference −V being −1.5 volts between the movable part 20 and the sensor electrode E21 produces the effective capacitances $C_{+V}$ and $C_{-V}$ which are equivalent to the capacitance produced by applying the voltage difference with +1 and −2 volts when the offset voltage is zero volt. As can be seen, the offset voltage V_offset influences the measurement results of the effective capacitance.

In one embodiment, if an effective capacitance difference ΔC of the effective capacitances corresponding to the applied voltages with +1.5 and −1.5 volts is within a predetermined range, then the MEMS device is determined to be hermetic. On the contrary, if the effective capacitance difference ΔC is out of the predetermined range, then the MEMS device is determined to be non-hermetic.

As a result, determining whether the MEMS device is hermetic can be achieved by applying different voltage differences between the movable part and the sensor electrode to compute the effective capacitance difference, and determining whether the effective capacitance difference is within a predetermined range.

Figure 4:
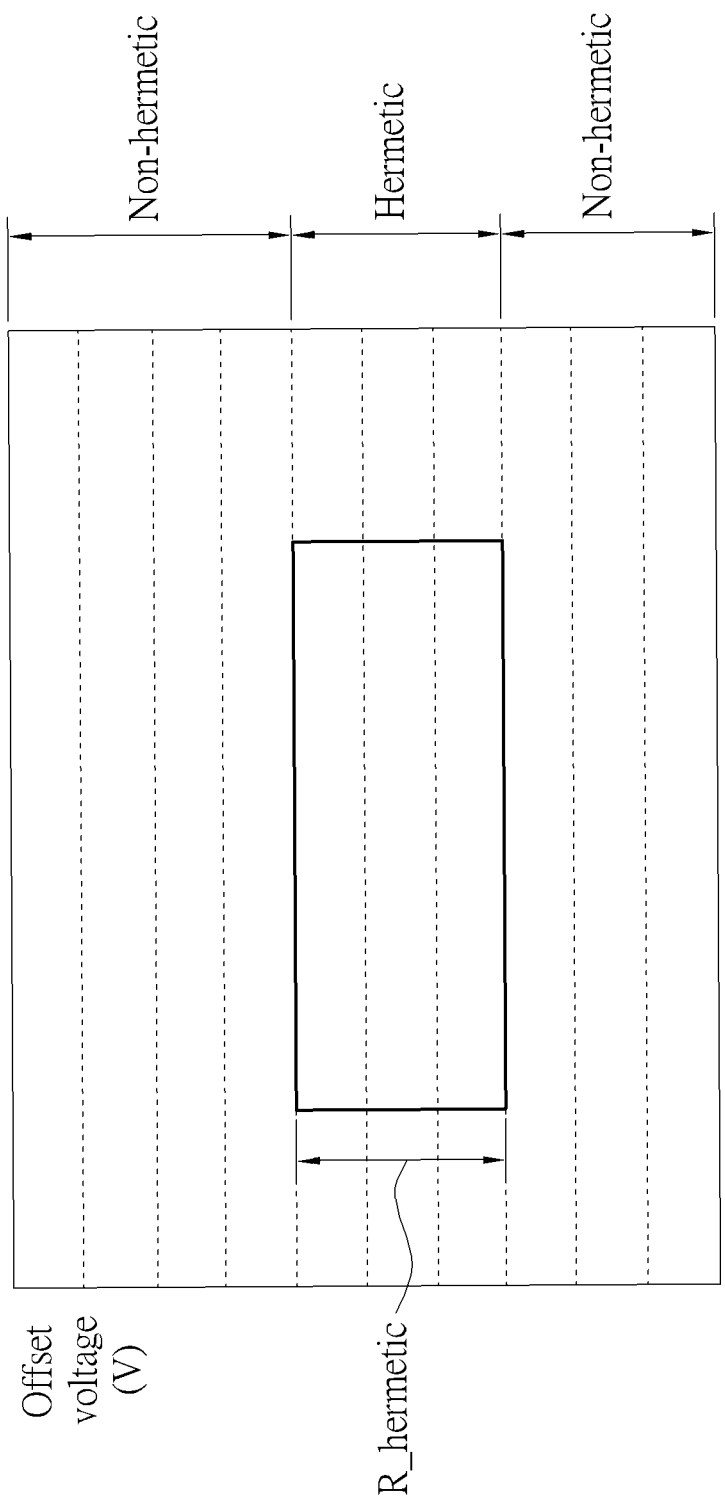
FIG. 4 illustrates correlations between offset voltage and hermeticity of a MEMS device according to an embodiment of the present invention.

FIG. 4 illustrates the correlation between the hermeticity and the offset voltage for a MEMS device according to an embodiment of the present invention. Since the capacitance-to-voltage curve is a parabola, it requires at least three coordinates to decide the vertex, shape and direction of opening of the parabola. In one embodiment, by respectively measuring the effective capacitances $C_{+V}$, $C_{-V}$ and $C_0$ corresponding to the voltage differences +V and −V and zero voltage, the capacitance-to-voltage curve of the MEMS device can be computed according to the three coordinates (+V, $C_{+V}$), (−V, $C_{-V}$) and (0, $C_0$), so as to compute the offset voltage V_offset accordingly. In other embodiments, by measuring three effective capacitances corresponding to three arbitrary voltage differences, the capacitance-to-voltage curve and the offset voltage V_offset of the MEMS device can be computed as well.

In FIG. 4, the offset voltage V_offset is within a predetermined range R_hermetic if the MEMS device is hermetic; otherwise, the offset voltage V_offset is out of the predetermined range R_hermetic if the MEMS device is non-hermetic, where the predetermined range R_hermetic is set according to a target capacitance-to-voltage curve and a target offset voltage of the MEMS device. As a result, by measuring the effective capacitances under different voltage differences applied to the MEMS device, an indicator of asymmetry (i.e., the offset voltage V_offset) for the capacitance-to-voltage curve of the MEMS device can be evaluated, so as to determine whether the MEMS device is hermetic to meet the application requirements.

In short, the present invention applies different voltage differences between the movable part and the sensor electrode of the MEMS device to measure corresponding effective capacitances, so as to evaluate the symmetry of the capacitance-to-voltage curve of the MEMS device, thereby determine the hermeticity of the MEMS device. In one embodiment, the present invention applies two different voltage differences (e.g., two voltage differences with the same value but opposite polarities) between the movable part and the sensor electrode of the MEMS device to compute the effective capacitance difference, and determines whether the effective capacitance difference is within a predetermined range, thereby determines whether the MEMS device is hermetic and meets the application requirements. In another embodiment, the present invention applies three different voltage differences (e.g., zero voltage and two voltage differences with the same value but opposite polarities) between the movable part and the sensor electrode of the MEMS device to compute the capacitance-to-voltage curve and the corresponding offset voltage, and determines whether the offset voltage is within a predetermined range, thereby determines whether the MEMS device is hermetic and meets the application requirements.

Those skilled in the can make modifications and alterations according to above mentioned method for detecting the hermeticity and the MEMS device, which is not limited in the embodiments of the present invention embodiment. Take the MEMS device 1 for example, either the sensor electrode E11 or the sensor electrode E12 can be applied with the external voltage difference. Specifically, when the voltage difference is applied between the movable part 10 and the sensor electrode E11, zero voltage is applied to another sensor electrode E12; or, when the voltage difference is applied between the movable part 10 and the sensor electrode E12, zero voltage is applied to another sensor electrode E11.

In addition, the effective capacitances can be measured by any measurement techniques, as long as all the MEMS devices made in the same batch are measured with the same measurement technique. Specifically, take FIG. 1 for example, the external voltage differences can be applied between the movable part 10 and the sensor electrode E11 to measure the effective capacitances between the movable part 10 and sensor electrode E11; or, the external voltage differences can be applied between the movable part 10 and the sensor electrode E11 to measure the effective capacitances between the movable part 10 and sensor electrode E12; or, the external voltage differences can be applied between the movable part 10 and the sensor electrode E12 to measure the effective capacitances between the movable part 10 and sensor electrode E11; or, the external voltage differences can be applied between the movable part 10 and the sensor electrode E12 to measure the effective capacitances between the movable part 10 and sensor electrode E12. In other words, when the voltage difference is assigned applying to the sensor electrode E11, the effective capacitances can be measured from the sensing capacitance induced between the sensor electrode E11 and the movable part 10, or from the sensing capacitance induced between the sensor electrode E12 and the movable part 10, and vice versa.

Further, the method of detecting hermeticity of the present invention can be performed in research and development phase as well as in normal usage. For research and development phase, an external device can be utilized to input different external voltages to the sensor electrode, evaluate the asymmetry characteristics of the MEMS device, determine the hermeticity of the MEMS device, and accordingly output analyzing results. As a result, the research and develop staff knows whether the MEMS device is hermetic or not according to the analyzing results, which is benefit for production process improvement and defective elimination.

Moreover, in research and development phase and normal usage, a microprocessor or an application-specific integrated circuit (ASIC) along with a memory device are configured to the MEMS device for handling detection results of the MEMS device in order to realize the accelerometer or the gyroscope. Therefore, the method of detecting hermeticity of the present invention can be compiled into a program code which is saved in the memory device as software or firmware program, where the program code instructs the microprocessor or the ASIC to execute operations associated with hermeticity detection. As a result, the MEMS device itself outputs analyzing results automatically, which allows the research and develop staff to know that whether the MEMS device is hermetic or not (i.e., know the functionality of the accelerometer or the gyroscope). As can be seen, the method of hermeticity detection of the present invention has the advantages of immediacy and easy measurement. Further, the MEMS device performs the hermeticity detection as self-testing, which can be performed in any moment and free from test errors from the external device. Therefore, the method of hermeticity detection of the present invention has the advantages of high sensitivity and high accuracy.

Figure 5:
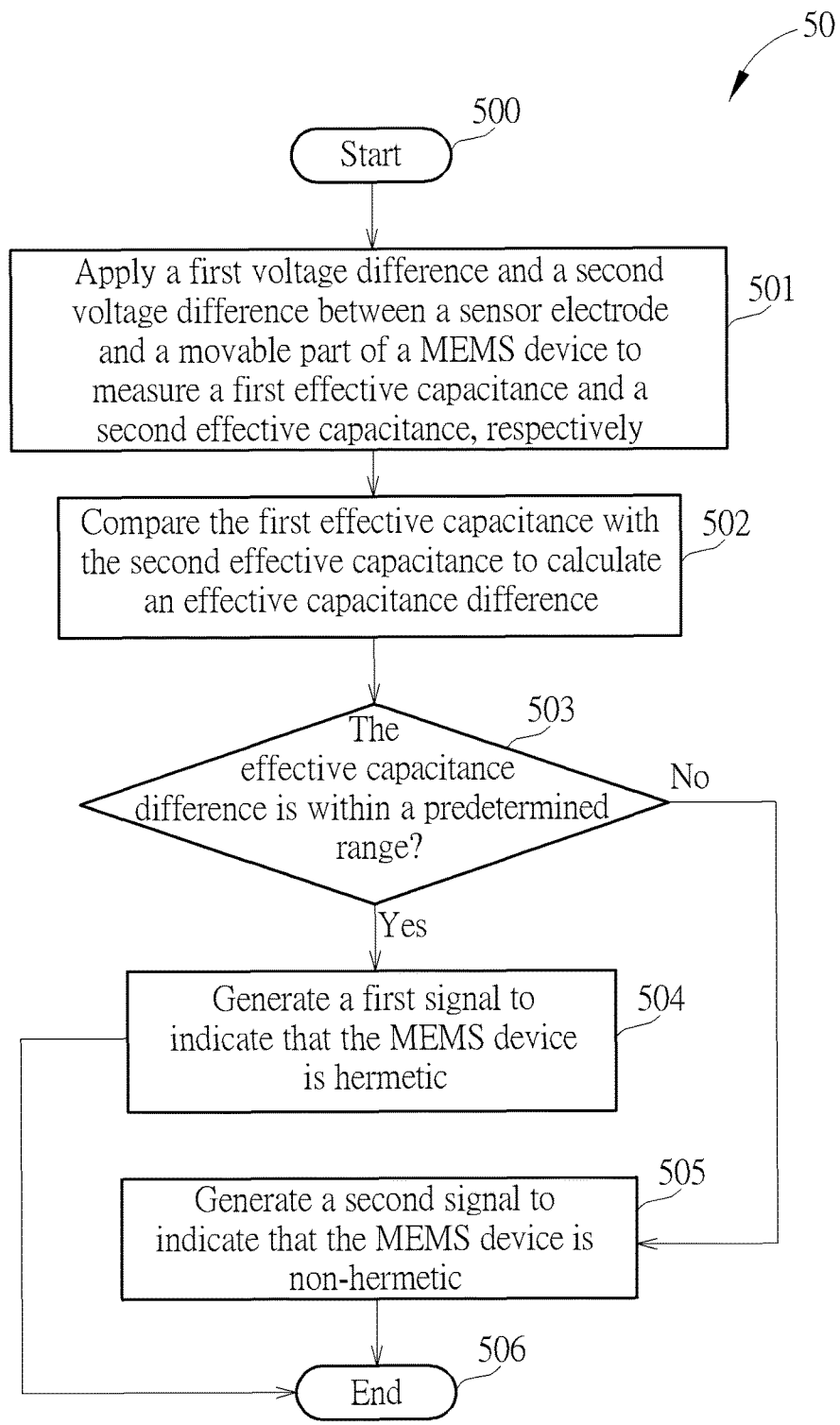
FIG. 5 is a flowchart of a method of hermeticity detection according to an embodiment of the present invention.

Operations described in FIG. 3 can be summarized into a process 50 for detecting hermeticity, as shown in FIG. 5, the process 50 can be compiled into a program code for detecting hermeticity of the MEMS device, and the process 50 includes the following steps.

Step 500: Start.
Step 501: Apply a first voltage difference and a second voltage difference between a sensor electrode and a movable part of a MEMS device to measure a first effective capacitance and a second effective capacitance, respectively.
Step 502: Compare the first effective capacitance with the second effective capacitance to calculate an effective capacitance difference.
Step 503: Determine whether the effective capacitance difference is within a predetermined range. Go to Step 504 if yes; Go to Step 505 if no.
Step 504: Generate a first signal to indicate that the MEMS device is hermetic. End.
Step 505: Generate a second signal to indicate that the MEMS device is non-hermetic.
Step 506: End.

Detailed operations about the process 50 can be obtained by referring to descriptions regarding FIG. 3, which is omitted.

Figure 6:
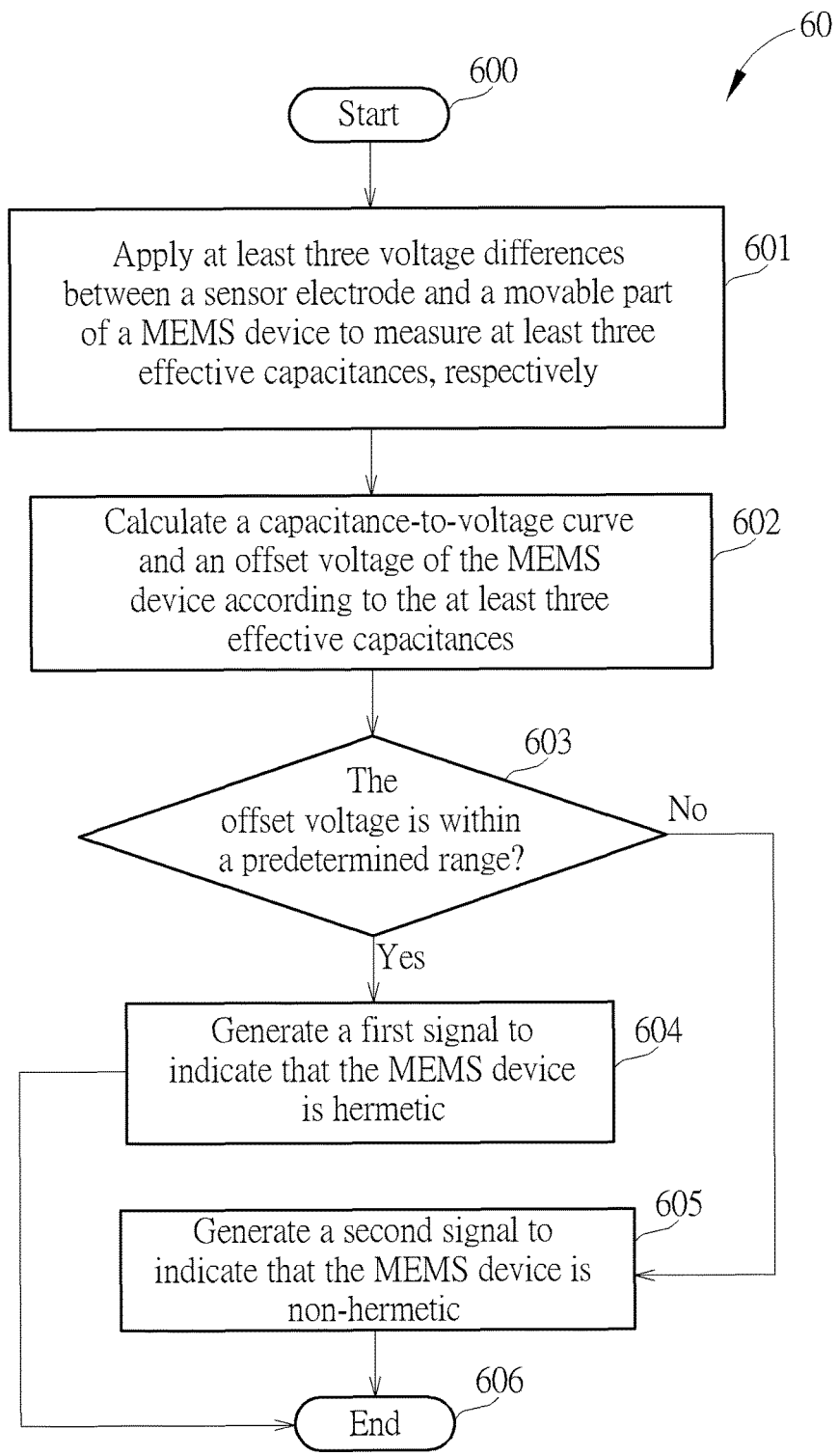
FIG. 6 is a flowchart of a method of hermeticity detection according to another embodiment of the present invention.

Operations described in FIG. 4 can be summarized into a process 60 for detecting hermeticity, as shown in FIG. 6, the process 60 can be compiled into a program code for detecting hermeticity of the MEMS device, and the process 60 includes the following steps.

Step 600: Start.
Step 601: Apply at least three voltage differences between a sensor electrode and a movable part of a MEMS device to measure at least three effective capacitances, respectively.
Step 602: Calculate a capacitance-to-voltage curve and an offset voltage of the MEMS device according to the at least three effective capacitances.
Step 603: Determine whether the offset voltage is within a predetermined range. Go to Step 604 if yes; go to Step 605 if no.
Step 604: Generate a first signal to indicate that the MEMS device is hermetic. End.
Step 605: Generate a second signal to indicate that the MEMS device is non-hermetic.
Step 606: End.

Detailed operations about the process 60 can be obtained by referring to descriptions regarding FIG. 4, which is omitted.

To sum up, the present invention measures multiple effective capacitances of the MEMS device to evaluate the symmetry of capacitance-to-voltage curve of the MEMS device, so as to determine the hermeticity of the MEMS device. In one embodiment, the present invention applies two different voltage differences (e.g., two voltage differences with the same value but opposite polarities) between the movable part and the sensor electrode of the MEMS device to compute the effective capacitance difference, and determine whether the effective capacitance difference is within a predetermined range, thereby determine the hermeticity of the MEMS device. In another embodiment, the present invention applies three different voltage differences (e.g., zero voltage and two voltage differences with the same value but opposite polarities) between the movable part and the sensor electrode of the MEMS device to compute the capacitance-to-voltage curve and the corresponding offset voltage, and determines whether the offset voltage is within a predetermined range, thereby determines whether the MEMS device is hermetic and meets the application requirements. The method of hermeticity detection of the present invention has the advantages of immediacy, easy measurement, high sensitivity and high accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of determining whether a microelectromechanical system (MEMS) device is hermetic, comprising:
    applying at least three different voltage differences between a movable part and a sensor electrode of the MEMS device to measure at least three effective capacitances;
    calculating a capacitance-to-voltage curve and an offset voltage of the MEMS device according to the at least three effective capacitances; and
    determining whether the offset voltage is within a predetermined range to determine whether MEMS device is hermetic.
2. The method of claim 1, wherein determining whether the offset voltage is within the predetermined range to determine whether MEMS device is hermetic comprises:
    generating a first signal to indicate that the MEMS device is hermetic if the offset voltage is within the predetermined range; and generating a second signal to indicate that the MEMS device is non-hermetic if the offset voltage is out of the predetermined range.

3. The method of claim 1, wherein the at least three effective capacitances is a sensing capacitance induced between the first sensor electrode and the movable part.

4. The method of claim 1, wherein the MEMS device further comprises a second sensor electrode, where the at least three effective capacitances is a sensing capacitance induced between the second sensor electrode and the movable part.

5. The method of claim 1, wherein the predetermined range is set according to a target capacitance-to-voltage curve and a target offset voltage of the MEMS device.

6. A method of determining whether a microelectromechanical system (MEMS) device is hermetic, comprising:
applying a first voltage difference and a second voltage difference between a first sensor electrode and a movable part of the MEMS device to measure a first effective capacitance and a second effective capacitance;
comparing the first effective capacitance with the second effective capacitance to calculate an effective capacitance difference; and
determining whether the effective capacitance difference is within a predetermined range to determine whether MEMS device is hermetic.

7. The method of claim 6, wherein determining whether the effective capacitance difference is within the predetermined range to determine whether MEMS device is hermetic comprises:
generating a first signal to indicate that the MEMS device is hermetic if the effective capacitance difference is within the predetermined range; and
generating a second signal to indicate that the MEMS device is non-hermetic if the effective capacitance difference is out of the predetermined range.

8. The method of claim 6, wherein the first effective capacitance and the second effective capacitance are sensing capacitances induced between the first sensor electrode and the movable part.

9. The method of claim 6, wherein the MEMS device further comprises a second sensor electrode, where the first effective capacitance and the second effective capacitance are sensing capacitances induced between the second sensor electrode and the movable part.

10. The method of claim 6, wherein the predetermined range is set according to a target capacitance-to-voltage curve and a target offset voltage of the MEMS device.

\* \* \* \* \*